(12) United States Patent
Vladimirsky et al.

(10) Patent No.: US 8,558,988 B2
(45) Date of Patent: Oct. 15, 2013

(54) THIN FILM CONTINUOUS SPATIALLY MODULATED GREY ATTENUATORS AND FILTERS

(75) Inventors: Yuli Vladimirsky, Weston, CT (US);
Lev Ryzhikov, Norwalk, CT (US);
Ronald A. Wilklow, Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 1083 days.

(21) Appl. No.: 12/265,235

(22) Filed: Nov. 5, 2008

(65) Prior Publication Data
US 2009/0122289 A1    May 14, 2009

Related U.S. Application Data

(60) Provisional application No. 60/996,350, filed on Nov. 13, 2007.

(51) Int. Cl.
G03B 27/42    (2006.01)
G03B 27/54    (2006.01)
G03B 27/72    (2006.01)

(52) U.S. Cl.
USPC .................................. 355/53; 355/67; 355/71

(58) Field of Classification Search
USPC ................................................ 355/53, 67, 71
See application file for complete search history.

(56) References Cited

U.S. PATENT DOCUMENTS

| | | | |
|---|---|---|---|
| 5,523,193 A * | 6/1996 | Nelson | 430/311 |
| 6,015,644 A | 1/2000 | Cirelli et al. | |
| 7,196,842 B2 | 3/2007 | Weigl et al. | |
| 2005/0179996 A1 * | 8/2005 | Weigl et al. | 359/359 |

FOREIGN PATENT DOCUMENTS

| | | |
|---|---|---|
| JP | 06-204111 A | 7/1994 |
| JP | 11-317356 A | 11/1999 |
| JP | 2002-286989 A | 10/2002 |
| JP | 2003-050311 A | 2/2003 |
| JP | 2003262750 A * | 9/2003 |
| JP | 2005-310909 A | 11/2005 |
| JP | 2007-279113 A | 10/2007 |

OTHER PUBLICATIONS

English language translation of Japanese Patent Publication No. 06-204111, published Jul. 22, 1994, the Japanese Patent Office; 1 page.

English language translation of Japanese Patent Publication No. 11-317356, published Nov. 16, 1999, the Japanese Patent Office; 1 page.

English language translation of Japanese Patent Publication No. 2005-310909, published Nov. 4, 2005, the Japanese Patent Office; 1 page.

English language translation of Japanese Patent Publication No. 2007-279113, published Oct. 25, 2007, the Japanese Patent Office; 1 page.

(Continued)

*Primary Examiner* — Peter B Kim

(74) *Attorney, Agent, or Firm* — Sterne, Kessler, Goldstein & Fox P.L.L.C.

(57) ABSTRACT

A system and method for use of a lithography apparatus having a substrate and an absorbing film formed on the substrate. A thickness of the absorbing film is spatially modulated across at least a part of the substrate to reduce a non-uniform intensity of a radiation beam transmitted through the substrate.

19 Claims, 8 Drawing Sheets

(56) References Cited

OTHER PUBLICATIONS

English language translation of Japanese Notification of Reasons for Refusal directed to related Japanese Patent Application No. 2008-288058, the Japanese Patent Office, mailed May 24, 2011; 3 pages.
English-Language Abstract for Japanese Patent Publication No. 2002-286989 A, published Oct. 3, 2002; 1 page.
English-Language Abstract for Japanese Patent Publication No. 2003-050311 A, published Feb. 21, 2003; 1 page.
English-Language Translation of Notification of Reasons(s) for Refusal, directed to related Japanese Patent Application No. 2008-288058, mailed Jan. 31, 2012, from the Japanese Patent Office; 2 pages.

* cited by examiner

THIN FILM CONTINUOUS SPATIALLY MODULATED GREY ATTENUATORS AND FILTERS

FIELD OF THE INVENTION

The present invention relates a lithographic apparatus and device manufacturing method.

BACKGROUND OF THE INVENTION

A lithographic apparatus is a machine that applies a desired pattern onto a workpiece or part of a workpiece. A lithographic apparatus may be used, for example, in the manufacture of flat panel displays, integrated circuits (ICs) and other devices involving fine structures. A conventional lithography apparatus includes, among other things, an illumination system to produce a uniform intensity distribution of a received laser beam. It is desirable that the resulting illumination be as uniform as possible and that any uniformity errors be kept as small as possible. Illumination uniformity influences an ability of the illumination system to produce uniform line widths across an entire exposure field. Illumination uniformity errors significantly impact quality of devices produced by the lithographic apparatus.

The conventional lithographic apparatus has a conventional filter having a pattern of opaque dots of modulated density that corrects exposure field non-uniformity. The dots are positioned out of focus to avoid projection onto the exposure field. Unfortunately, the dots diffract incident light and limit achievable spatial frequencies. The diffraction of the incident light distorts illumination modes, particularly for a conventional lithographic apparatus having small-coherence illuminations and small numerical apertures. Further, for a lithographic system with a large demagnification, such as an optical maskless lithography system, the conventional filter also requires submicron-sized dots, which makes the conventional filter expensive.

The conventional filter is formed on a plano-parallel substrate. Thus, if a projected image is to be magnified or demagnified in addition to being filtered by the conventional filter, then the conventional lithographic apparatus requires additional optical elements to adjust the magnification. This requirement unnecessarily adds complexity and excessive cost to the conventional lithographic apparatus.

Therefore, what is needed is an apparatus and method that overcomes the above shortcomings.

SUMMARY

In one embodiment of the present invention, there is provided a lithography apparatus comprising a substrate and an absorbing film formed on the substrate. A thickness of the absorbing film is spatially modulated across at least a part of the substrate to reduce a non-uniform intensity of a radiation beam transmitted through the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 6A-D illustrate examples of an exemplary attenuator where the substrate is not plano-parallel.

Figure 7:
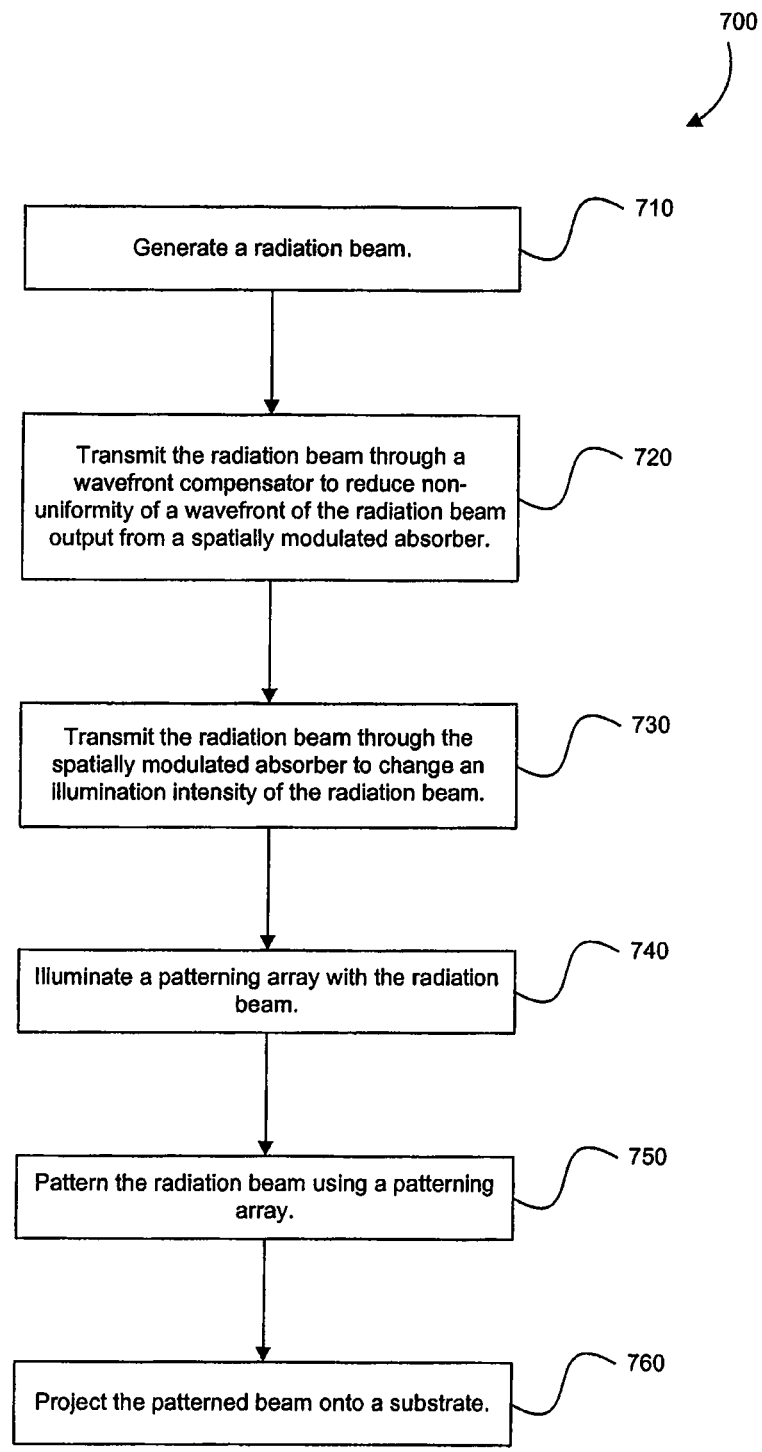

FIG. 7 illustrates a method 700 for reducing non-uniformity of a radiation beam intensity.

One or more embodiments of the present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
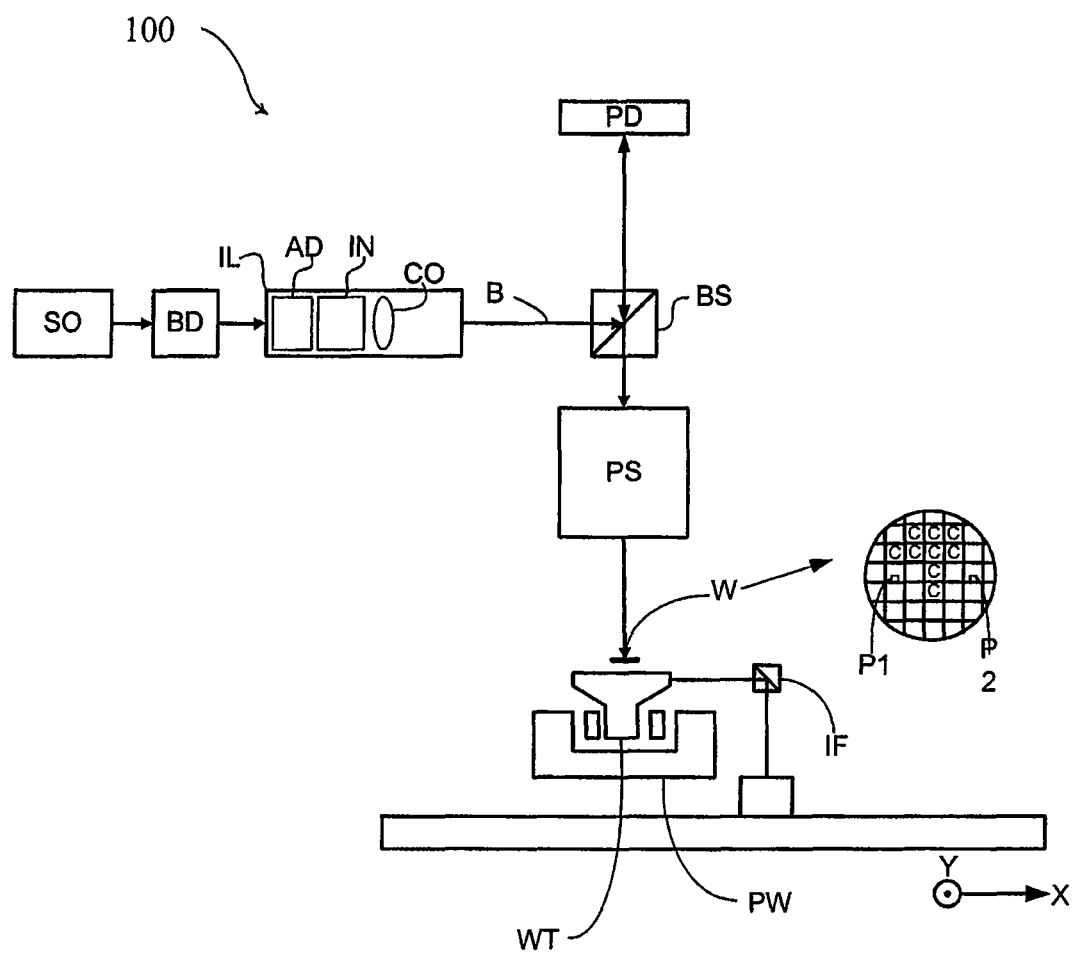
FIGS. 1 and 2 depict a lithographic apparatus, according to various embodiments of the present invention.

FIG. 1 schematically depicts a lithographic apparatus 100 in an embodiment of the invention. The apparatus comprises an illumination system IL, a patterning device PD, a workpiece table WT, and a projection system PS. The illumination system (illuminator) IL is configured to condition a radiation beam B (e.g., UV radiation).

The workpiece table WT is constructed to support a workpiece (e.g., a resist-coated workpiece) W and connected to a positioner PW configured to accurately position the workpiece W in accordance with certain parameters.

The projection system (e.g., a refractive projection lens system) PS is configured to project the beam of radiation modulated by the array of individually controllable elements onto a target portion C (e.g., comprising one or more dies) of the workpiece W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

The illumination system may include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it may instead be connected to a positioner configured to accurately position the array of individually controllable elements in accordance with certain parameters.

The term "patterning device" or "contrast device" used herein should be broadly interpreted as referring to any device that may be used to modulate the cross-section of a radiation beam, such as to create a pattern in a target portion of the workpiece W. The devices may be either static patterning devices (e.g., masks or reticles) or dynamic (e.g., arrays of programmable elements) patterning devices. For brevity, most of the description will be in terms of a dynamic patterning device, however it is to be appreciated that a static pattern device may also be used without departing from the scope of the present invention.

It should be noted that the pattern imparted to the radiation beam may not exactly correspond to the desired pattern in the target portion of the workpiece W, for example if the pattern includes phase-shifting features or so called assist features. Similarly, the pattern eventually generated on the workpiece W may not correspond to the pattern formed at any one instant on the array of individually controllable elements. This may be the case in an arrangement in which the eventual pattern formed on each part of the workpiece W is built up over a given period of time or a given number of exposures during which the pattern on the array of individually controllable elements and/or the relative position of the workpiece W changes.

Generally, the pattern created on the target portion of the workpiece W will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array may comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light may be filtered out of the reflected beam, leaving only the diffracted light to reach the workpiece W. In this manner, the beam becomes patterned according to the addressing pattern of the matrix-addressable surface.

It will be appreciated that, as an alternative, the filter may filter out the diffracted light, leaving the undiffracted light to reach the workpiece W.

An array of diffractive optical MEMS devices (micro-electro-mechanical system devices) may also be used in a corresponding manner. In one example, a diffractive optical MEMS device is composed of a plurality of reflective ribbons that may be deformed relative to one another to form a grating that reflects incident light as diffracted light.

A further alternative example of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam may be patterned according to the addressing pattern of the matrix-addressable mirrors. The required matrix addressing may be performed using suitable electronic means. Another example PD is a programmable LCD array.

The lithographic apparatus 100 may comprise one or more contrast devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements, and/or a common projection system (or part of the projection system).

In one example, such as the embodiment depicted in FIG. 1, the workpiece W has a substantially circular shape, optionally with a notch and/or a flattened edge along part of its perimeter. In another example, the workpiece W has a polygonal shape, e.g., a rectangular shape.

Examples where the workpiece W has a substantially circular shape include examples where the workpiece W has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the workpiece W has a diameter of at most 500 mm, at most 400 mm, at most 350 mm, at most 300 mm, at most 250 mm, at most 200 mm, at most 150 mm, at most 100 mm, or at most 75 mm.

Examples where the workpiece W is polygonal, e.g., rectangular, include examples where at least one side, at least 2 sides or at least 3 sides, of the workpiece W has a length of at least 5 cm, at least 25 cm, at least 50 cm, at least 100 cm, at least 150 cm, at least 200 cm, or at least 250 cm.

At least one side of the workpiece W has a length of at most 1000 cm, at most 750 cm, at most 500 cm, at most 350 cm, at most 250 cm, at most 150 cm, or at most 75 cm.

In one example, the workpiece W is a wafer, for instance a semiconductor wafer. The wafer material may be selected from the group consisting of Si, SiGe, SiGeC, SiC, Ge, GaAs, InP, and InAs. The wafer may be: a III/V compound semiconductor wafer, a silicon wafer, a ceramic workpiece, a glass workpiece, or a plastic workpiece. The workpiece W may be transparent (to the naked human eye), colored, or absent a color.

The thickness of the workpiece W may vary and, to an extent, may depend on the workpiece material and/or the workpiece dimensions. The thickness may be at least 50 µm, at least 100 µm, at least 200 µm, at least 300 µm, at least 400 µm, at least 500 µm, or at least 600 µm. Alternatively, the thickness of the workpiece W may be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The workpiece W referred to herein may be processed, before or after exposure, in for example a track (a tool that typically applies a layer of resist to a workpiece W and develops the exposed resist), a metrology tool, and/or an inspection tool. In one example, a resist layer is provided on the workpiece W.

The projection system may image the pattern on the array of individually controllable elements, such that the pattern is coherently formed on the workpiece W. Alternatively, the projection system may image secondary sources for which the elements of the array of individually controllable elements act as shutters. In this respect, the projection system may comprise an array of focusing elements such as a micro lens array (MLA) or a Fresnel lens array to form the secondary sources and to image spots onto the workpiece W. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements may be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA may be movable (e.g., with the use of one or more actuators) at least in the direction to and away from the workpiece W. Being able to move the MLA to and away from the workpiece W allows, e.g., for focus adjustment without having to move the workpiece W.

Figure 2:
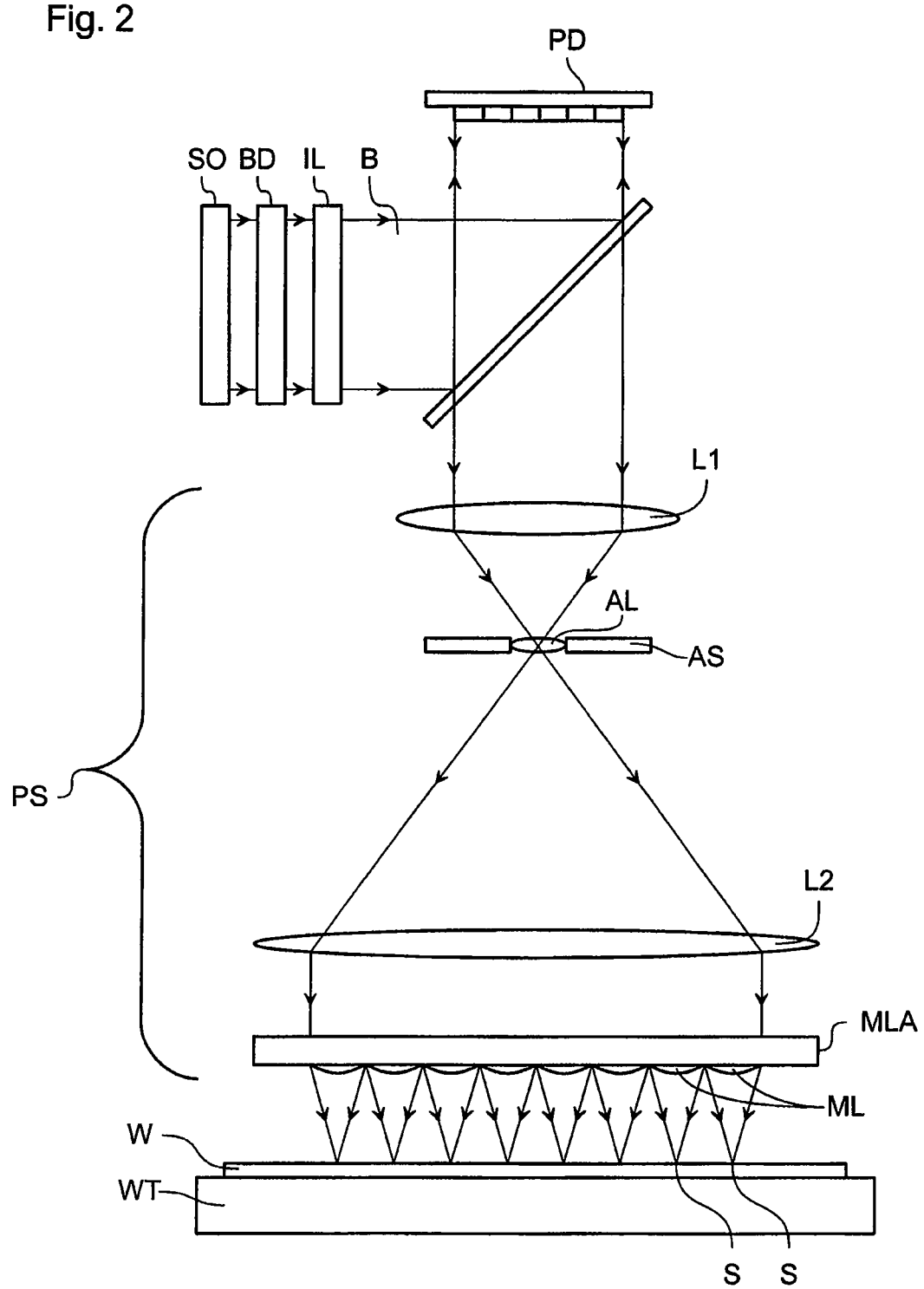

As herein depicted in FIGS. 1 and 2, the apparatus is of a reflective type (e.g., employing a reflective array of individually controllable elements). Alternatively, the apparatus may be of a transmission type (e.g., employing a transmission array of individually controllable elements).

The lithographic apparatus 1 may be of a type having two (dual stage) or more workpiece tables WT. In such "multiple stage" machines, the additional tables may be used in parallel, or preparatory steps may be carried out on one or more tables while one or more other tables are being used for exposure.

The lithographic apparatus 100 may also be of a type wherein at least a portion of the workpiece W may be covered by an "immersion liquid" having a relatively high refractive index, e.g., water, so as to fill a space between the projection system and the workpiece W. An immersion liquid may also be applied to other spaces in the lithographic apparatus 100, for example, between the patterning device and the projection system. Immersion techniques are well known in the art for increasing the numerical aperture of projection systems. The term "immersion" as used herein does not mean that a structure, such as a workpiece W, must be submerged in liquid, but rather only means that liquid is located between the projection system and the workpiece W during exposure.

Referring again to FIG. 1, the illuminator IL receives a radiation beam from a radiation source SO. The radiation source SO provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by the radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation may have a wavelength including substantially 436 nm, substantially 405 nm, substantially 365 nm, substantially 355 nm, substantially 248 nm, substantially 193 nm, substantially 157 nm, and/or substantially 126 nm. In a further example, the radiation provided by the source SO has a wavelength in the deep ultraviolet part of the spectrum.

The source SO and the lithographic apparatus 100 may be separate entities, for example when the source SO is an excimer laser. In such cases, the source SO is not considered to form part of the lithographic apparatus 100 and the radiation beam is passed from the source SO to the illuminator IL with the aid of a beam delivery system BD comprising, for example, suitable directing mirrors and/or a beam expander. In other cases the source SO may be an integral part of the lithographic apparatus 100, for example when the source SO is a mercury lamp. The source SO and the illuminator IL, together with the beam delivery system BD if required, may be referred to as a radiation system.

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL may be adjusted. In addition, the illuminator IL may comprise various other components, such as an integrator IN and a condenser CO. The illuminator IL may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the workpiece W. With the aid of the positioner PW and position sensor IF2 (e.g., an interferometric device, linear encoder, capacitive sensor, or the like), the workpiece table WT may be moved accurately, e.g., so as to position different target portions C in the path of the radiation beam B. Where used, the positioning means for the array of individually controllable elements may be used to correct accurately the position of the patterning device PD with respect to the path of the beam B, e.g., during a scan.

In one example, movement of the workpiece table WT is realized with the aid of a long-stroke module (course positioning) and a short-stroke module (fine positioning), which are not explicitly depicted in FIG. 1. In another example, a short stroke stage may not be present. A similar system may also be used to position the array of individually controllable elements. It will be appreciated that the beam B may alternatively/additionally be moveable, while the object table and/or the array of individually controllable elements may have a fixed position to provide the required relative movement. Such an arrangement may assist in limiting the size of the apparatus. As a further alternative, which may, e.g., be applicable in the manufacture of flat panel displays, the position of the workpiece table WT and the projection system PS may be fixed and the workpiece W may be arranged to be moved relative to the workpiece table WT. For example, the workpiece table WT may be provided with a system for scanning the workpiece W across it at a substantially constant velocity.

As shown in FIG. 1, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. The beam of radiation may be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmission patterning device is used.

The depicted apparatus may be used in several modes:

1. In step mode, the array of individually controllable elements and the workpiece W are kept essentially stationary, while an entire pattern imparted to the radiation beam is projected onto a target portion C at one go (i.e., a single static exposure). The workpiece table WT is then shifted in the X and/or Y direction so that a different target portion C may be exposed. In step mode, the maximum size of the exposure field limits the size of the target portion C imaged in a single static exposure.

2. In scan mode, the array of individually controllable elements and the workpiece W are scanned synchronously while a pattern imparted to the radiation beam is projected onto a target portion C (i.e., a single dynamic exposure). The velocity and direction of the workpiece W relative to the array of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the workpiece W using a pulsed radiation source. The workpiece table WT is moved with an essentially constant speed such that the beam B is caused to scan a line across the workpiece W. The pattern on the array of individually controllable elements is updated as required between pulses of the radiation system and the pulses are timed such that successive target portions C are exposed at the required locations on the workpiece W. Consequently, the beam B may scan across the workpiece W to expose the complete pattern for a strip of the workpiece W. The process is repeated until the workpiece W has been exposed line by line.

4. Continuous scan mode is essentially the same as pulse mode except that the workpiece W is scanned relative to the modulated beam of radiation B at a substantially constant speed and the pattern on the array of individually controllable elements is updated as the beam B scans across the workpiece W and exposes it. A substantially constant radiation source or a pulsed radiation source, synchronized to the updating of the pattern on the array of individually controllable elements, may be used.

5. In pixel grid imaging mode, which may be performed using the lithographic apparatus of FIG. 2, the pattern formed on workpiece W is realized by subsequent exposure of spots formed by a spot generator that are directed onto patterning device PD. The exposed spots have substantially the same shape. On workpiece W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use may also be employed.

In lithography, a pattern is exposed on a layer of resist on the workpiece W. The resist is then developed. Subsequently, additional processing steps are performed on the workpiece W. The effect of these subsequent processing steps on each portion of the workpiece W depends on the exposure of the resist. In particular, the processes are tuned such that portions of the workpiece W that receive a radiation dose above a given dose threshold respond differently to portions of the workpiece W that receive a radiation dose below the dose threshold. For example, in an etching process, areas of the workpiece W that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern may be etched. In particular, the individually controllable elements in the patterning device PD are set such that the radiation that is transmitted to an area on the workpiece W within a pattern feature is at a sufficiently high intensity that the area receives a dose of radiation above the dose threshold during the exposure. The remaining areas on the workpiece W receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence a precise position of a pattern feature boundary, may be controlled more precisely by setting the individually controllable elements that provide radiation to points on the workpiece W that are on or near the pattern feature boundary. These may be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the workpiece W by a given individually controllable element may only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values may be projected onto the workpiece W.

It should be appreciated that grayscaling may be used for additional or alternative purposes to that described above. For example, the processing of the workpiece W after the exposure may be tuned, such that there are more than two potential responses of regions of the workpiece W, dependent on received radiation dose level. For example, a portion of the workpiece W receiving a radiation dose below a first threshold responds in a first manner; a portion of the workpiece W receiving a radiation dose above the first threshold but below a second threshold responds in a second manner; and a portion of the workpiece W receiving a radiation dose above the second threshold responds in a third manner. Accordingly, grayscaling may be used to provide a radiation dose profile across the workpiece W having more than two desired dose levels. The radiation dose profile may have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the workpiece W, as described above. For example, the radiation dose received by each point on the workpiece W may alternatively or additionally be controlled by controlling the duration of the exposure of the point. As a further example, each point on the workpiece W may potentially receive radiation in a plurality of successive exposures. The radiation dose received by each point may, therefore, be alternatively or additionally controlled by exposing the point using a selected subset of the plurality of successive exposures.

FIG. 2 depicts an arrangement of the apparatus according to an embodiment that may be used, e.g., in the manufacture of flat panel displays. Components corresponding to those shown in FIG. 1 are depicted with the same reference numerals. Also, the above descriptions of the various embodiments, e.g., the various configurations of the workpiece W, the contrast device, the MLA, the beam of radiation B, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the workpiece W. In this way an array of radiation spots S is exposed onto the workpiece W. It will be appreciated that, although only eight lenses of the illustrated array of lenses 14 are shown, the array of lenses may comprise many thousands of lenses (the same is true of the array of individually controllable elements used as the patterning device PD).

Figure 3:
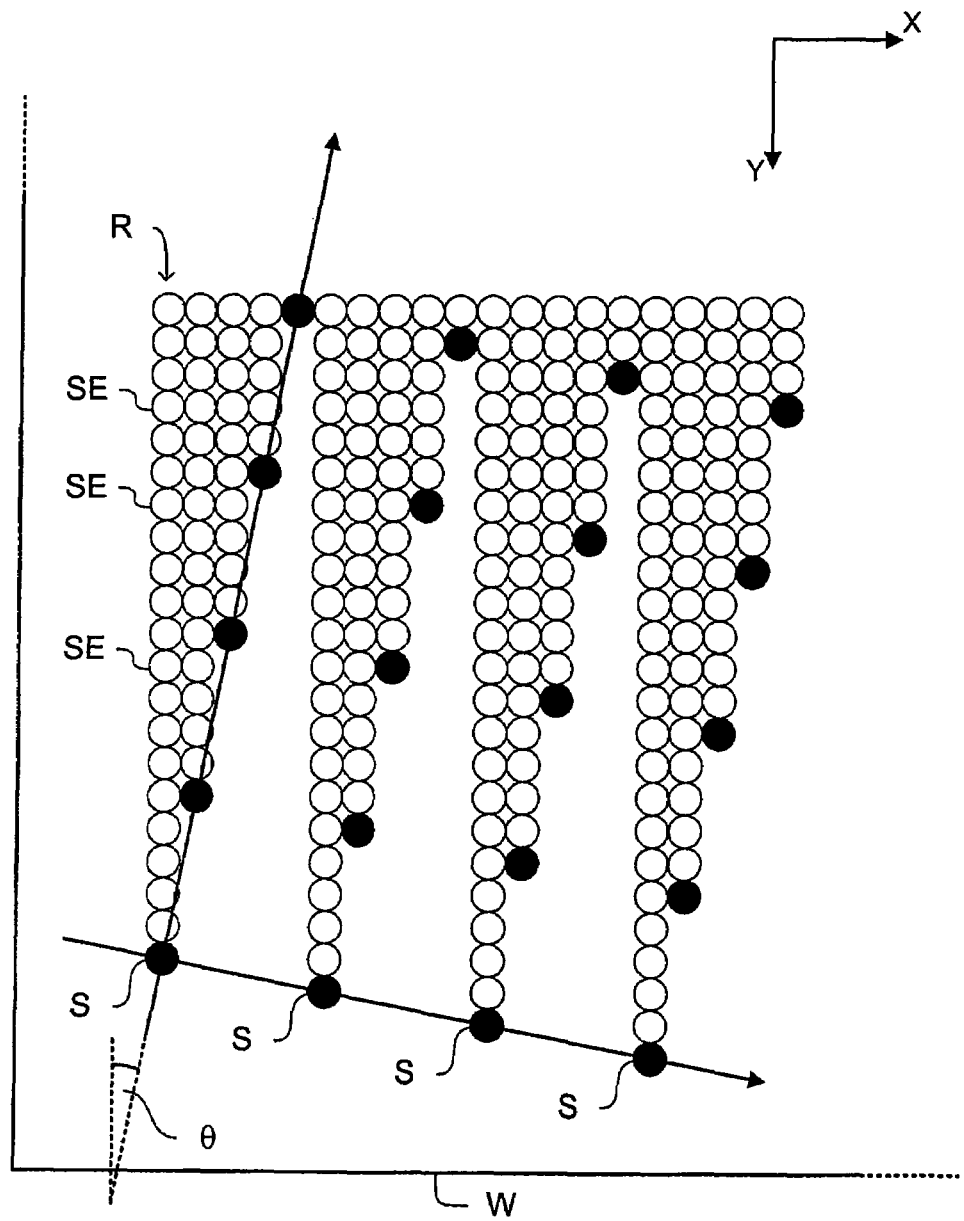
FIG. 3 depicts a mode of transferring a pattern to a workpiece according to one embodiment of the invention as shown in FIG. 2.

FIG. 3 illustrates schematically how a pattern on a workpiece W is generated using the system of FIG. 2, according to one embodiment of the present invention. The filled in circles represent the array of spots S projected onto the workpiece W by the array of lenses MLA in the projection system PS. The workpiece W is moved relative to the projection system PS in the Y direction as a series of exposures are exposed on the workpiece W. The open circles represent spot exposures SE that have previously been exposed on the workpiece W. As shown, each spot projected onto the workpiece W by the array of lenses within the projection system PS exposes a row R of spot exposures on the workpiece W. The complete pattern for the workpiece W is generated by the sum of all the rows R of spot exposures SE exposed by each of the spots S. Such an arrangement is commonly referred to as "pixel grid imaging," discussed above.

It may be seen that the array of radiation spots S is arranged at an angle θ relative to the workpiece W (the edges of the workpiece W lie parallel to the X and Y directions). This is done so that when the workpiece W is moved in the scanning direction (the Y-direction), each radiation spot will pass over a different area of the workpiece W, thereby allowing the entire workpiece W to be covered by the array of radiation spots 15. The angle θ may be at most 20°, at most 10°, at most 5°, at most 3°, at most 1°, at most 0.5°, at most 0.25°, at most 0.10°, at most 0.05°, or at most 0.01°. Alternatively, the angle θ is at least 0.001°.

Figure 4:
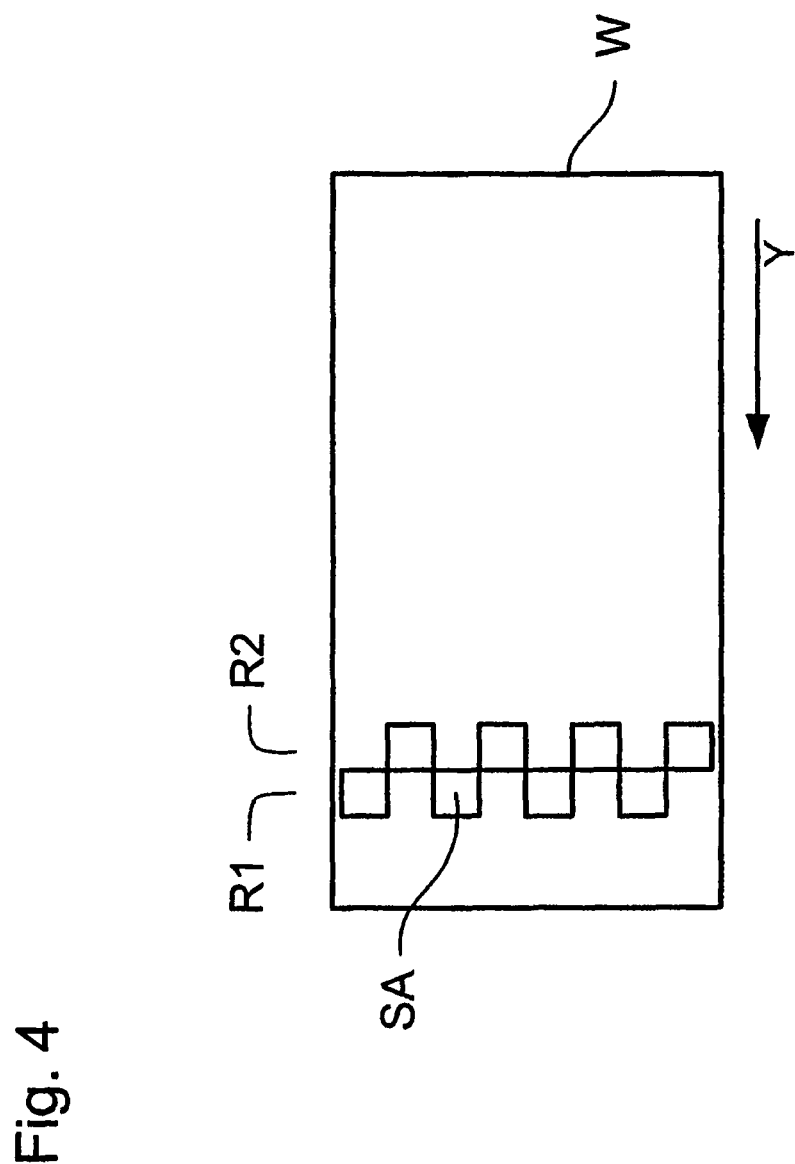
FIG. 4 depicts an arrangement of optical engines, according to one embodiment of the present invention.

FIG. 4 shows schematically how an entire flat panel display workpiece W may be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the workpiece W, allowing exposure of the entire workpiece W to be performed in a single scan. It will be appreciated that any suitable number of optical engines may be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine may comprise a separate illumination system IL, patterning device PD and projection system PS as described above. It is to be appreciated, however, that two or more optical engines may share at least a part of one or more of the illumination system IL, patterning device PD and projection system PS.

Figure 5:
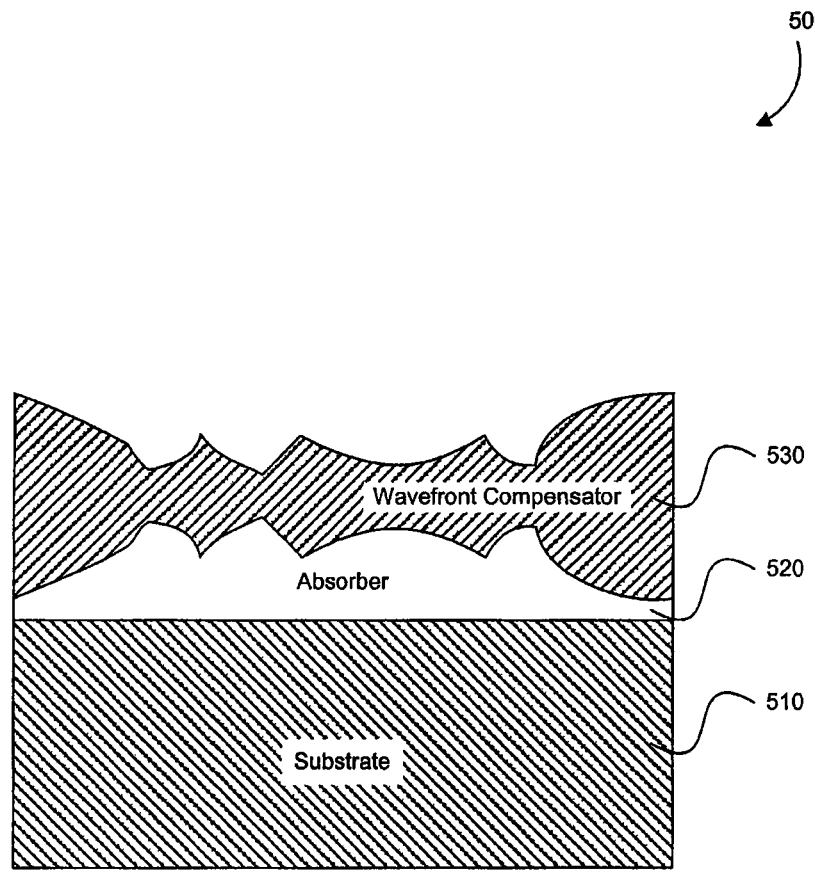
FIG. 5 illustrates an exemplary attenuator.

FIG. 5 illustrates an exemplary attenuator 500. The attenuator 500 may be used in a lithographic apparatus having a small numerical aperture, such as an optical maskless lithography (OML) system. The lithographic apparatus 100 illustrated in FIG. 1 is an example of an OML in which the attenuator 500 attenuates an intensity of the radiation beam B. In an example, a high spatial frequency of radiation intensity non-uniformity may be mitigated by positioning the attenuator 500 in the reticle (i.e. patterning device PD) or reticle conjugate planes. In a further example, the attenuator 500 is a continuous film grey filter.

The attenuator 500 has a transparent substrate 510 which supports an absorbing film 520. The absorbing film 520 is an absorbing film that is spatially modulated across at least a part of the substrate 510. The absorbing film 520 reduces non-uniformity of an intensity of the radiation beam B that is transmitted through the attenuator 500. The attenuator 500 optionally has a transparent wavefront compensator 530 which compensates for a refractive effect of the absorbing film 520 that deforms a wavefront passing through the absorbing film 520. The component parts of the attenuator 500 are described in further detail below.

The substrate 510 supports the absorbing film 520 and is transparent to a beam of radiation transmitted through the substrate 510. For example, the substrate 510 is transparent to deep-ultraviolet radiation, such as radiation having a wavelength of substantially 193 nm.

The absorbing film 520 is an absorbing film that is located on, and spatially modulated across, at least a part of the substrate 510. The absorbing film 520 simultaneously transmits some of the radiation beam B and absorbs some of the radiation beam B. The quantities of transmission and absorption vary by location on the substrate 510 dependent upon a thickness of the absorbing film 520 at that location on the substrate 510. In an example, the absorbing film 520 is non-curvilinear across at least a part of the substrate 510.

By replacing sub-micron sized dots with the absorbing film 520, the attenuator 500 is less expensive than the conventional filter and does not diffract incident light. Therefore the attenuator 500 does not limit achievable spatial frequencies or distort illumination modes.

The performance of the absorbing film 520 is determined by absorption law. The transmitted intensity is determined by the equation: $I_{tr}(t)=I_0 \exp(-\alpha \cdot t)=I_0 \exp(-l^{-1}t)$ where t is a period of time, $I_{tr}$ is the transmitted intensity, $I_0$ is the intensity of radiation incident on the absorbing film 520, $\alpha$ is the absorption coefficient of the absorbing film material, and l is the absorption length (i.e. the thickness of the absorbing film 520). The absorption length is related to the absorption coefficient by the equation $l=\alpha^{-1}$. Further, the absorbed radiation intensity is determined by the equation $I_{abs}(t)=I_0(1-\exp(-l^{-1}t))$. Therefore, the relationship between absorbing film thickness and transmitted intensity is inverse. Conversely, the relationship between absorbing film thickness and absorbing film intensity is proportionate.

As shown in FIG. 5, the absorbing film thickness varies across the substrate 510 to reduce a non-uniform intensity of the radiation beam B transmitted through the absorbing film 520. The absorbing film thickness is non-zero in a portion of the absorbing film 520 that transmits the radiation beam B. Thus, as the thickness of the absorbing film 520 varies across the substrate 510, the quantities of light transmitted and absorbed by the absorbing film 520 also vary across the substrate 510. Further, an intensity of radiation beam B transmitted through the absorbing film 520 also varies across the substrate 510, dependent upon absorbing film thickness. In portions of the absorbing film 520 that transmit a part of the radiation beam B having a high intensity, the absorbing film 520 is thicker than in other portions of the absorbing film 520 that transmit a part of the radiation beam B having a low intensity, so that the part of the radiation beam B having the high intensity is attenuated more than the part of the radiation beam B having the low intensity. The result is that the absorbing film 520 reduces non-uniformity of intensity of the transmitted radiation beam B.

The composition of the absorbing film 520 and a concomitant thickness of the absorbing film 520 are determined by factors such as a wavelength ($\lambda$) of the transmitted radiation beam B and an extinction coefficient (k) of the absorbing film material. The extinction coefficient (k) is an imaginary part of the refractive index $\tilde{n}=n+ik$ of the absorbing film material. A range of acceptable absorption lengths (l) (i.e. absorbing film thicknesses) based on a range of acceptable extinction coefficients (k) is determined by the equation: $l=\lambda/4\pi k$. Similarly, a range of acceptable extinction coefficients (k) based on a range of acceptable absorption lengths (l) is determined by the equation: $k=\lambda/4\pi l$.

In an example, a range of acceptable absorption lengths (l) (i.e. acceptable absorbing film 520 thicknesses) is 500 nm to 2000 nm and the wavelength ($\lambda$) of the transmitted radiation is substantially 193 nm. An absorption length (l) less than 500 nm and/or greater than 2000 nm may also be used. Similarly, the wavelength ($\lambda$) of the transmitted radiation may be at a wavelength other than 193 nm. These constraints result in a range of acceptable extinction coefficients ($k_{abs}$) from 0.008 to 0.03. Thus, if an absorbing film material having an extinction coefficient (k) less than 0.008 is used, the resultant absorbing film thickness will be too thick and the absorbing film will require excessively deep thickness modulation. Conversely, if an absorbing film material having an extinction coefficient (k) greater than 0.03 is used, the resultant absorbing film thickness will be too thin and require excessively shallow thickness modulation.

In an example, for an absorbing film 520 having an absorbance between 5% to 10%, a maximum absorbing film thickness (l) is in a range from 50 nm to 200 nm. In a further example, for an absorbing film 520 having an absorbance between 0.05% to 0.1%, a minimum absorbing film thickness (l) is in a range from 0.3 nm to 1 nm.

The composition of the absorbing film 520 may be determined from the range of acceptable extinction coefficients ($k_{abs}$). Continuing with the example above, there are a number of materials that have an extinction coefficient (k) within the range of 0.008 through 0.03. The following table presents optical properties of materials from which the absorbing film 520 may be fabricated when the wavelength of the transmitted radiation ($\lambda$) is substantially 193 nm n:

| Material name | Formula | Extinction coefficient ($\lambda$) | Refractive index | Comments |
|---|---|---|---|---|
| Diamond | C | 0.01 | 2.944 | cubic carbon |
| Silicon Oxide | $SiO_2$ | $<10^{-6}$ | 1.56 | used as a wavefront compensator |
| Silicon Oxy-Nitrides $SiO_XN_Y$ | $SiO_{0.9}N_{0.1}$ | ~0.016 | ~1.6 | extrapolated data |
| | $SiO_{0.8}N_{0.2}$ | ~0.027 | ~1.7 | extrapolated data |
| | $SiO_{0.6}N_{0.4}$ | ~0.05 | ~1.8 | extrapolated data |
| | $SiO_{0.4}N_{0.6}$ | ~0.09 | ~2.0 | extrapolated data |
| | $SiO_{0.2}N_{0.8}$ | ~0.14 | ~2.2 | extrapolated data |
| Silicon Nitride | $Si_3N_4$ | 0.23 | 2.66 | |

As illustrated in the table, most of the materials used to form the absorbing film 520 are silicon oxy-nitrides ($SiO_xN_y$). Silicon oxy-nitrides are non-stoichiometric compounds with a varying oxy-nitride component that forms compounds ranging from fused silica ($SiO_2$) to silicon nitride ($Si_3N_4$). The value of extinction coefficient (k) for a silicon oxy-nitride depends on composition and respectively varies from <10-6 to 0.23. The value of extinction coefficient (k) may be adjusted by adjusting the composition. As shown in the table, small concentrations of oxy-nitride are beneficial in that they provide reasonable absorption and refractive index values close to that of fused silica. In an example, an absorbing film 520 is composed of less than 20% nitrogen, but more than 0% nitrogen. The table includes data for diamond film for comparison. The table above also provides data for silicon oxide ($SiO_2$), from which a wavefront compensator 530 may be formed.

Still referring to FIG. 5, the wavefront compensator 530 is an optional feature of the attenuator 500 that mitigates the refractive effect of the absorbing film 520. The wavefront compensator 530 may be a film formed on the substrate 510. In an example, the substrate 510 itself is modulated and acts as a wavefront compensator 530 to mitigate the refractive effect of the absorbing film 520.

The thickness modulation of the absorbing film 520 induces wavefront deformation ($\Delta\omega_{abs}$) that is proportional to the modulation of the absorbing layer ($\Delta t_{abs}$). The following equation illustrates an effect of the modulation of the absorbing layer ($\Delta t_{abs}$) on wavefront deformation ($\Delta\omega_{abs}$): $\Delta\omega_{abs} = n_{abs} \cdot (t_{abs} - \bar{t}_{abs}) = n_{abs} \cdot \Delta t_{abs}$ where $n_{abs}$ is the refractive index of the absorbing film 520, $t_{abs}$ is a thickness of the absorbing film 520 at a location on the substrate 510, and $\bar{t}_{abs}$ is an average absorbing film thickness.

Complete mitigation of the wavefront deformation ($\Delta\omega_{abs}$) requires a wavefront compensator 530, such as a transparent compensation film having a complementary thickness variation ($\Delta t_{comp}$) as determined by the equation:

$$-\Delta t_{comp} = \frac{n_{abs}}{n_{comp}} \Delta t_{abs}$$

where $n_{abs}$ is the refractive index of the absorbing film 520 and $n_{comp}$ is a refractive index of the wavefront compensator 530. Thus, the thickness of the wavefront compensator 530 is inversely proportional to the thickness of the absorbing film 520. In an example, as illustrated in FIG. 5, when a plano-parallel substrate 510 is used, the thickness of the wavefront compensator 530, when added to the thickness of the absorbing film 520, need not produce a second plano surface due to differences between the refractive index of the wavefront compensator 530 ($n_{comp}$) and the refractive index of the absorbing film 520 ($n_{abs}$). However, the substrate 510 need not have even a single plano surface.

FIGS. 6A-D illustrate examples of the attenuator 500 where the substrate 510 is not plano-parallel. Thus, in these examples, the substrate 510 provides magnification or demagnification of the radiation beam B. The attenuator 500 is not limited to the substrate shapes described herein. The absorbing film 520 may be located on a substrate 510 having any shape. Similarly, the wavefront compensator 530 may be located on a substrate 510 having any shape. For example, the shape of a substrate 510 may be plano, concave, convex, curvilinear, non-curvilinear, and/or any combination of these shapes. The combination of the absorbing film 520 with the substrate 510 having optical power reduces a number of optical elements in, and thus reduces complexity and a cost of, the lithographic system 100.

Figure 6A:
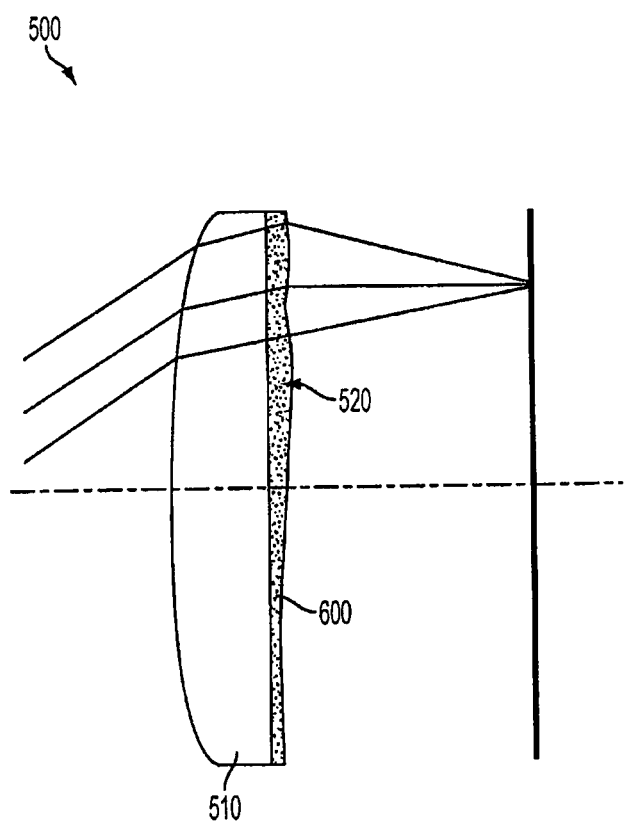

FIG. 6A illustrates an example of the attenuator 500 including a convex-plano substrate 510 having an absorbing film 520 located on the plano surface 600.

Figure 6B:
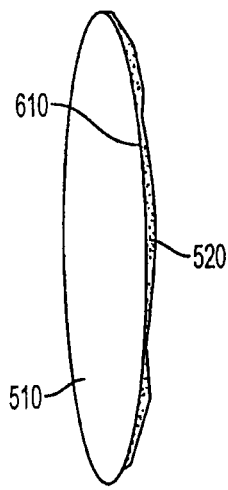

FIG. 6B illustrates an example of the attenuator 500 including a convex-convex substrate 510 having an absorbing film 520 located on a convex surface 610.

Figure 6C:
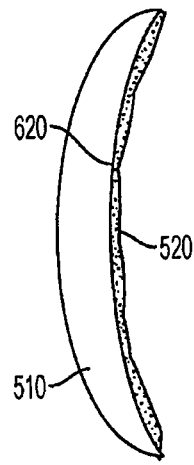

FIG. 6C illustrates an example of the attenuator 500 including a convex-concave substrate 510 having an absorbing film 520 located on a concave surface 620.

Figure 6D:
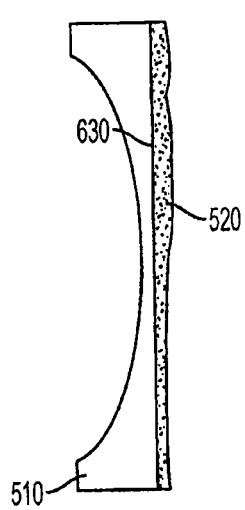

FIG. 6D illustrates a concave-plano substrate 510 having an absorbing film 520 located on a plano surface 630.

FIG. 7 illustrates a method 700 for reducing non-uniformity of intensity of a radiation beam. In step 710, a radiation beam is generated. In step 720, the radiation beam is transmitted through a wavefront compensator 530 to decrease wavefront non-uniformity of the radiation beam output from a spatially modulated absorbing film 520. In step 730, the radiation beam is transmitted through the spatially modulated absorbing film 520 to change an illumination intensity of the radiation beam. In step 740, a patterning array is illuminated with the radiation beam. In step 750, the radiation beam is patterned using a patterning array. In step 760, the patterned beam is projected onto a workpiece. In an example, the steps 720 and 740 through 760 are optional. Steps 720 and 730 need not be performed in numerical order.

Although specific reference may be made in this text to the use of lithographic apparatus 100 in the manufacture of a specific device (e.g., an integrated circuit or a flat panel display), it should be understood that the lithographic apparatus 100 described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus may be used to assist in the creation of a variety of layers, e.g. a thin film transistor layer and/or a color filter layer.

Although specific reference is made above to the use of embodiments of the invention in the context of optical lithography, it will be appreciated that the invention may be used in other applications, for example imprint lithography, where the context allows, and is not limited to optical lithography. In imprint lithography a topography in a patterning device defines the pattern created on a workpiece. The topography of the patterning device may be pressed into a layer of resist supplied to the workpiece whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail may be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A lithography apparatus, comprising:
a substrate;
an absorbing film formed on the substrate;
a wavefront compensator configured to compensate for a refractive effect of the absorbing film and formed on the substrate,
wherein a thickness of the absorbing film is spatially modulated across at least a part of the substrate to reduce a non-uniform intensity of a radiation beam transmitted through the substrate, and
wherein a thickness of the wavefront compensator is inversely proportional to the spatially modulated thickness of the absorbing film across at least a part of the substrate.

2. The apparatus of claim 1, wherein the thickness of the absorbing film is non-curvilinear across at least a part of the substrate.

3. The apparatus of claim 1, wherein the absorbing film comprises a material having an extinction coefficient from about $10^{-6}$ to about 0.23.

4. The apparatus of claim 1, wherein the absorbing film comprises silicon oxy-nitride.

5. The apparatus of claim 4, wherein the silicon oxy-nitride comprises zero percent nitrogen to about twenty percent nitrogen.

6. The apparatus of claim 1, wherein the wavefront compensator comprises silicon oxide.

7. The apparatus of claim 1, wherein the substrate has a piano surface.

8. The apparatus of claim 1, wherein the substrate has a non-piano surface.

9. A lithography apparatus, comprising:
an illumination system configured to condition a beam of radiation;
a patterning device configured to pattern the beam of radiation;
a projection system configured to project the patterned beam onto a target area of a workpiece; and
an attenuator to condition the beam of radiation including a substrate,
an absorbing film located on the substrate, and
a wavefront compensator configured to compensate for a refractive effect of the absorbing film and formed on the substrate,
wherein a thickness of the absorbing film is spatially modulated across at least a part of the substrate to reduce a non-uniform intensity of the radiation beam, and
wherein a thickness of the wavefront compensator is inversely proportional to the thickness of the absorbing film across at least a part of the substrate.

10. The apparatus of claim 9, wherein the beam of radiation has a wavelength of substantially 193 nanometers.

11. The apparatus of claim 9, wherein the absorbing film has a non-curvilinear thickness across at least a part of the substrate.

12. The apparatus of claim 9, wherein the absorbing film comprises a material having an extinction coefficient from about $10^{-6}$ to about 0.23.

13. The apparatus of claim 9, wherein the absorbing film comprises silicon oxy-nitride.

14. The apparatus of claim 13, wherein the silicon oxy-nitride comprises from zero percent nitrogen to about twenty percent nitrogen.

15. The apparatus of claim 9, wherein the wavefront compensator comprises silicon oxide.

16. The apparatus of claim 9, wherein the substrate has a piano surface.

17. The apparatus of claim 9, wherein the substrate has a non-piano surface.

18. A method, comprising:
transmitting a radiation beam through a wavefront compensator located on a substrate to reduce wavefront non-uniformity of the radiation beam; and
transmitting the radiation beam through an absorbing film located on the substrate, wherein the absorbing film has a thickness that is spatially modulated across at least a part of the substrate to reduce a non-uniform intensity of the radiation beam, and wherein a thickness of the wavefront compensator is inversely proportional to the thickness of the absorbing film across at least a part of the substrate.

19. The method of claim 18, further comprising:
illuminating a patterning array with the radiation beam;
patterning the radiation beam using a patterning array; and
projecting the patterned beam onto a workpiece.

* * * * *

UNITED STATES PATENT AND TRADEMARK OFFICE
CERTIFICATE OF CORRECTION

PATENT NO. : 8,558,988 B2  
APPLICATION NO. : 12/265235  
DATED : October 15, 2013  
INVENTOR(S) : Vladimirsky et al.

Page 1 of 1

It is certified that error appears in the above-identified patent and that said Letters Patent is hereby corrected as shown below:

In the claims

In column 15, claim 7, line 37, please delete "piano" and insert --plano--
In column 15, claim 8, line 39, please delete "non-piano" and insert --non-plano--
In column 16, claim 16, line 29, please delete "piano" and insert --plano--
In column 16, claim 17, line 31, please delete "non-piano" and insert --non-plano--

Signed and Sealed this
Eighteenth Day of February, 2014

Michelle K. Lee
*Deputy Director of the United States Patent and Trademark Office*